(12) United States Patent
Zang et al.

(10) Patent No.: US 12,160,015 B2
(45) Date of Patent: Dec. 3, 2024

(54) CONDUCTIVE FILM, FABRICATION METHOD OF CONDUCTIVE FILM, AND LITHIUM-ION BATTERY (LIB)

(71) Applicant: CHONGQING JIMAT NEW MATERIAL TECHNOLOGY CO., LTD., Chongqing (CN)

(72) Inventors: Shiwei Zang, Chongqing (CN); Wenqing Liu, Chongqing (CN)

(73) Assignee: CHONGQING JIMAT NEW MATERIAL TECHNOLOGY CO., LTD., Chongqing (CN)

( * ) Notice: Subject to any disclaimer, the term of this patent is extended or adjusted under 35 U.S.C. 154(b) by 480 days.

(21) Appl. No.: 17/765,844

(22) PCT Filed: Jun. 10, 2021

(86) PCT No.: PCT/CN2021/099434
§ 371 (c)(1),
(2) Date: Apr. 1, 2022

(87) PCT Pub. No.: WO2022/147961
PCT Pub. Date: Jul. 14, 2022

(65) Prior Publication Data
US 2023/0187775 A1 Jun. 15, 2023

(30) Foreign Application Priority Data
Jan. 11, 2021 (CN) .......................... 202110032066.9

(51) Int. Cl.
H01M 50/383 (2021.01)
C23C 14/20 (2006.01)
(Continued)

(52) U.S. Cl.
CPC ......... H01M 50/383 (2021.01); C23C 14/205 (2013.01); C23C 14/24 (2013.01);
(Continued)

(58) Field of Classification Search
CPC ............. H01M 50/383; H01M 4/0426; H01M 4/1395; H01M 4/661; H01M 4/667;
(Continued)

(56) References Cited

U.S. PATENT DOCUMENTS

2006/0105243 A1* 5/2006 Okamura .............. H01M 4/668
429/234
2012/0315537 A1* 12/2012 Ravdel .................. H01M 4/667
29/623.5
2020/0313155 A1 10/2020 Zhang et al.

FOREIGN PATENT DOCUMENTS

CN 108336357 A 7/2018
CN 109994740 A 7/2019
(Continued)

Primary Examiner — Aiqun Li
(74) Attorney, Agent, or Firm — Samson G. Yu

(57) ABSTRACT

A conductive film, a fabrication method of the conductive film, and a lithium-ion battery (LIB) are provided. The fabrication method includes: S10: selecting a support layer, and plating a first metal layer on upper and lower surfaces of the support layer, respectively; S20: compounding a first film on a surface of one of the first metal layers, and compounding a second film on a surface of the other one of the first metal layers; S30: compounding a third film on surfaces of the first film and the second film, and etching a plurality of circular holes penetrating through the third film and the second film; S40: plating a second metal layer on an outer surface of the third film and an inner wall of the circular hole; S50: fabricating a composite film; and S60: plating a third metal layer on upper and lower surfaces of the composite film.

20 Claims, 3 Drawing Sheets

(51) Int. Cl.
  *C23C 14/24* (2006.01)
  *C23C 14/35* (2006.01)
  *H01M 4/02* (2006.01)
  *H01M 4/04* (2006.01)
  *H01M 4/1395* (2010.01)
  *H01M 4/66* (2006.01)
  *H01M 10/0525* (2010.01)

(52) U.S. Cl.
  CPC ........... *C23C 14/35* (2013.01); *H01M 4/0426* (2013.01); *H01M 4/1395* (2013.01); *H01M 4/661* (2013.01); *H01M 4/667* (2013.01); *H01M 4/668* (2013.01); *H01M 10/0525* (2013.01); *H01M 2004/027* (2013.01)

(58) Field of Classification Search
  CPC . H01M 4/668; H01M 10/0525; C23C 14/205; C23C 14/24; C23C 14/35; H01B 5/14
  See application file for complete search history.

(56) References Cited

FOREIGN PATENT DOCUMENTS

| | | |
|---|---|---|
| CN | 111048788 A | 4/2020 |
| CN | 112712918 A | 4/2021 |
| EP | 3916862 A1 | 12/2021 |
| JP | 2010056037 A | 3/2010 |
| JP | 2011174009 A | 9/2011 |
| JP | 2019147357 A | 9/2019 |

* cited by examiner

CONDUCTIVE FILM, FABRICATION METHOD OF CONDUCTIVE FILM, AND LITHIUM-ION BATTERY (LIB)

CROSS REFERENCE TO THE RELATED APPLICATIONS

This application is the national phase entry of International Application No. PCT/CN2021/099434, filed on Jun. 10, 2021, which is based upon and claims priority to Chinese Patent Application No. 202110032066.9, filed on Jan. 11, 2021, the entire contents of which are incorporated herein by reference.

TECHNICAL FIELD

The present disclosure relates to the technical field of film fabrication, and particularly to a conductive film, a fabrication method of the conductive film, and a lithium-ion battery (LIB).

BACKGROUND

LIBs are secondary batteries (rechargeable batteries), which work mainly depending on the movement of lithium ions between a positive electrode and a negative electrode. Due to the call of the state and the fact of global climate change, LIBs are increasingly focused on as a category of clean energy.

Currently, people's attention to LIBs mainly lies in the energy density and safety performance of LIBs, which are related to the promotion and application prospects of LIBs. In terms of safety, during the actual use of LIBs, thermal runaway is the main reason for heating or even combustion explosion of LIBs. Thermal runaway is a phenomenon in which the internal heat of a battery continuously increases for some reasons and this increase cannot be stopped.

SUMMARY

In order to overcome the deficiencies of the prior art, the present disclosure provides a conductive film, a fabrication method of the conductive film, and an LIB, which can prevent the battery from overheating and burning, and improve the electrical conductivity and tensile strength of the conductive film.

The present disclosure adopts the following technical solutions to solve the technical problem: In an aspect, a fabrication method of a conductive film is provided, including the following steps:

S10: selecting a support layer, and plating a first metal layer on upper and lower surfaces of the support layer, respectively;

S20: compounding a first film on a surface of one of the first metal layers, and compounding a second film on a surface of the other one of the first metal layers;

S30: compounding a third film on surfaces of the first film and the second film by a film compounding technology, and etching a plurality of circular holes penetrating through the third film and the second film, where a depth of each of the plurality of circular holes is equal to a sum of a thickness of the third film and a thickness of the second film;

S40: plating a second metal layer on an outer surface of the third film and an inner wall of the circular hole by a vacuum coating technology;

S50: peeling off the third film from the second film while retaining the second metal layer plated on the inner wall of the circular hole of the second film;

filling a flame retardant in the circular hole, and filling a layer of modified paraffin on the flame retardant for sealing to obtain a composite film;

or, filling a flame retardant in the circular hole, filling a layer of modified paraffin on the flame retardant, refilling a flame retardant based on the modified paraffin, and refilling a modified paraffin for sealing to obtain a composite film; and S60: plating a third metal layer on upper and lower surfaces of the composite film by a vacuum coating technology, and rolling to obtain the conductive film.

Further, in S10, the first metal layer may be plated on the surfaces of the first support layer using a vacuum coating device, and the vacuum coating device may include a magnetron sputtering device or a vacuum evaporation device.

Further, the first metal layer and the third metal layer each may be a copper or aluminum layer with a thickness of 200 nm to 300 nm, and the second metal layer may be a lithium layer with a thickness of 20 nm to 100 nm.

Further, in S20, a coating compounding device may be used to realize the compounding of the first film and the second film.

Further, in S30, the circular hole may have a diameter of 500 nm to 600 nm.

Further, in S50, the flame retardant may be trimethyl phosphate (TMP).

Further, in S50, the modified paraffin may include the following components: 6 to 7 parts of paraffin, 0.5 to 1 parts of lithium chloride, 0.5 to 3 parts of conductive graphite, and 1 to 3 parts of dodecanoic acid; and the modified paraffin may have a softening point of 65° C. to 80° C.

In another aspect, the present disclosure also provides a conductive film, including a support layer, a first metal layer, a first film, a second film, and a third metal layer;

where both an upper surface and a lower surface of the support layer are plated with the first metal layer, and the first film and the second film are compounded on surfaces of the two first metal layers, respectively;

a plurality of circular holes penetrate through the first film and the second film, an inner wall of the circular hole is plated with a second metal layer having an annular cross-section, and a flame-retardant layer is filled in the circular hole plated with the second metal layer; and both an outer surface of the first film and an outer surface of the second film are plated with the third metal layer.

In the above structure, the flame-retardant layer may include a flame retardant at a bottom layer and a modified paraffin above the flame retardant; and the flame retardant may be TMP.

In the above structure, the flame-retardant layer may include a first flame retardant at a bottom layer, a first modified paraffin above the first flame retardant, a second flame retardant above the first modified paraffin, and a second modified paraffin above the second flame retardant; and the flame retardant may be TMP.

In the above structure, the first metal layer and the third metal layer each may be a copper or aluminum layer with a thickness of 200 nm to 300 nm, and the second metal layer may be a lithium layer with a thickness of 20 nm to 100 nm.

In another aspect, the present disclosure also provides an LIB, including a conductive film fabricated by the fabrication method of a conductive film described above.

The present disclosure has the following beneficial effects: The flame retardant sealed by the modified paraffin is arranged in the circular hole of the second film, such that, when a temperature reaches a softening point of the modified paraffin, the paraffin melts in the hole, and the flame retardant is released from the hole to prevent a battery from overheating and burning. The second metal layer is a lithium layer, which can also increase an energy density of a battery after the flame retardant is released.

DETAILED DESCRIPTION OF THE EMBODIMENTS

The present disclosure is further described below with reference to the accompanying drawings and examples.

In order to make the objectives, features, and effects of the present disclosure fully understood, the concepts, specific structures, and technical effects of the present disclosure will be clearly and completely described below in conjunction with the examples and accompanying drawings. Apparently, the described examples are merely some rather than all of the examples of the present disclosure. All other examples obtained by those skilled in the art based on the examples of the present disclosure without creative efforts should fall within the protection scope of the present disclosure. In addition, all the coupling/connection relations involved in the present disclosure do not only refer to the direct connection of the components, but refer to the fact that a better connection structure can be formed by adding or reducing connection accessories according to specific implementation conditions. The various technical features created by the present disclosure can be combined interactively under the premise of not conflicting with each other.

Example 1

Figure 1:
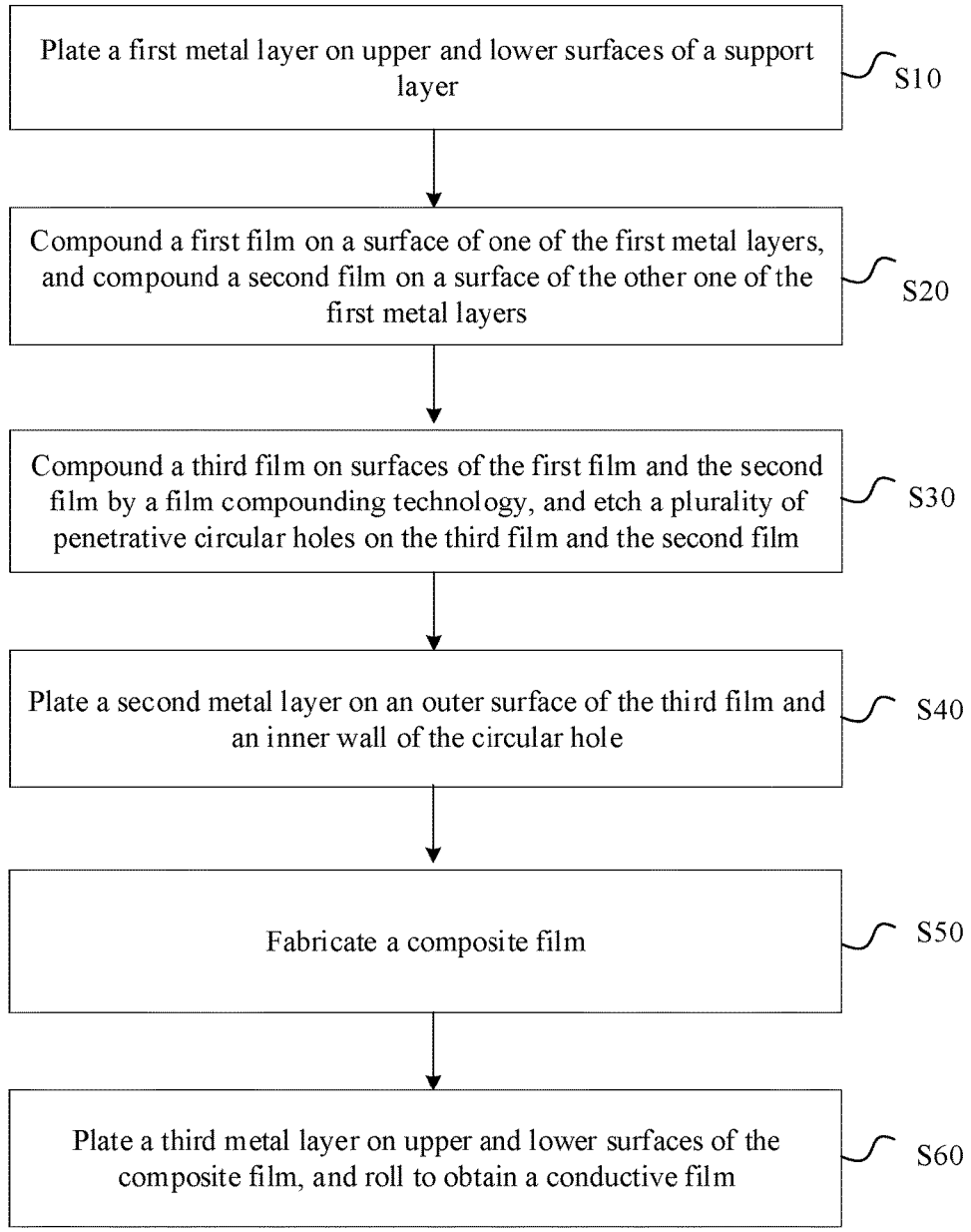
FIG. 1 is a schematic flow chart of the fabrication method of a conductive film according to the present disclosure.
Figure 2:
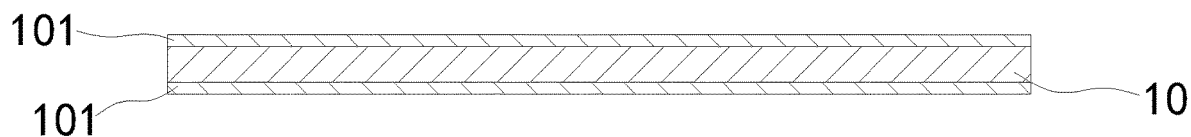
FIG. 2 is a schematic structural diagram in S10 of the fabrication method of a conductive film according to the present disclosure.

As shown in FIG. 1, the present disclosure discloses a fabrication method of a conductive film. In this example, the fabrication method includes the following steps:

S10: A support layer 20 is selected, and a first metal layer 101 is plated on upper and lower surfaces of the support layer 10, respectively, where the support layer 10 is a polyethylene terephthalate (PET) film, and a formed structure is shown in FIG. 2.

In this example, the first metal layer 101 may be plated on the surfaces of the first support layer 10 using a vacuum coating device; the vacuum coating device may include a magnetron sputtering device or a vacuum evaporation device; and the first metal layer 101 may be a copper layer with a thickness of 200 nm.

The main function of the first metal layer 101 is to increase the electrical conductivity and increase the elongation at break of the entire conductive film. In this example, the vacuum coating device is a magnetron sputtering device; and magnetron sputtering is conducted under the following conditions: vacuum degree: $0.1 \times 10^{-3}$ Pa to $1.0 \times 10^{-3}$ Pa, and sputtering gas: argon at a flow rate of 50 ml/min to 60 ml/min, and the pressure and flow rate can speed up the process and improve the production efficiency.

Figure 3:
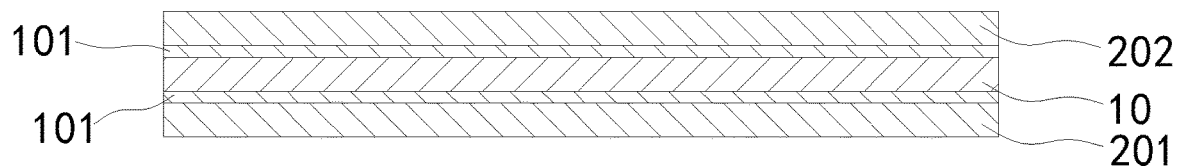
FIG. 3 is a schematic structural diagram in S20 of the fabrication method of a conductive film according to the present disclosure.

S20: A first film 201 is compounded on a surface of one of the first metal layers 101, and a second film 202 is compounded on a surface of the other one of the first metal layers 101. In this example, as shown in FIG. 3, the second film 202 is compounded on a surface of the first metal layer 101 located above, and the first film 201 is compounded on a surface of the first metal layer 101 located below; and a coating compounding device is used to realize the compounding of the first film 201 and the second film 202.

Figure 4:
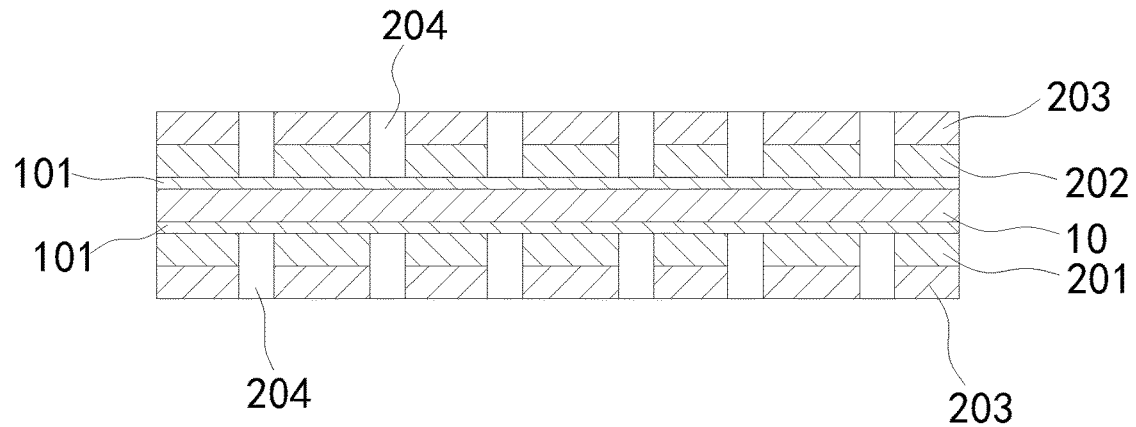
FIG. 4 is a schematic structural diagram in S30 of the fabrication method of a conductive film according to the present disclosure.

S30: A third film 203 is compounded on surfaces of the first film 201 and the second film 202 using a film compounding technology, and a plurality of circular holes 204 are etched to penetrate through the third film 203 and the second film 202, where a depth of each of the plurality of circular holes 204 is equal to a sum of a thicknesses of the second film 202 and a thicknesses of the third film 203. FIG. 4 is a schematic structural diagram of the plurality of circular holes 204 etched on the third film 203, and the circular holes 204 have a diameter of 500 nm.

Figure 5:
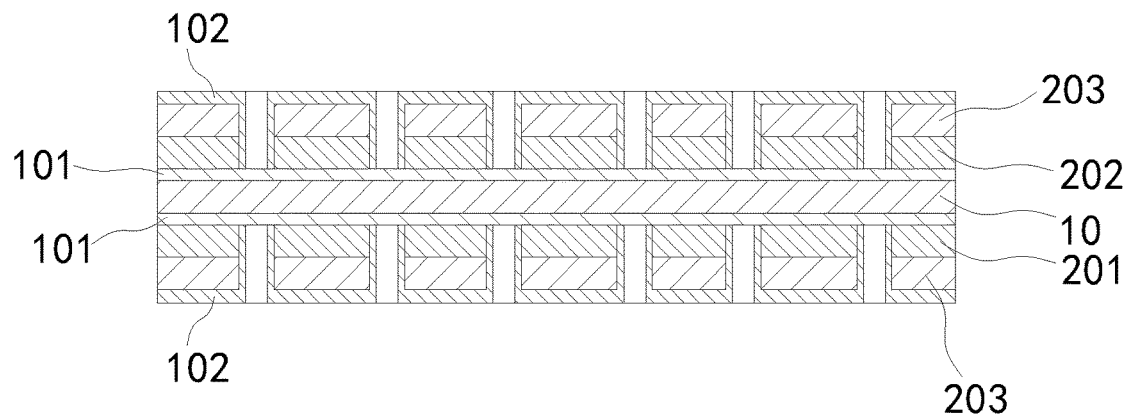
FIG. 5 is a schematic structural diagram in S40 of the fabrication method of a conductive film according to the present disclosure.

S40: A second metal layer 102 is plated on an outer surface of the third film 203 and an inner wall of the circular hole 204 using a vacuum coating technology. As shown in FIG. 5, the inner wall of the circular hole 204 is plated with the second metal layer 102, but the second metal layer 102 does not completely seal the circular hole 204, and thus a plurality of blind holes are formed on the second metal layer 102.

S50: The third film 203 is peeled off from the second film 202, while the second metal layer 102 plated on the inner wall of the circular hole 204 of the second film 202 is retained, where the second metal layer 102 is a lithium layer with a thickness of 100 nm.

Figure 6:
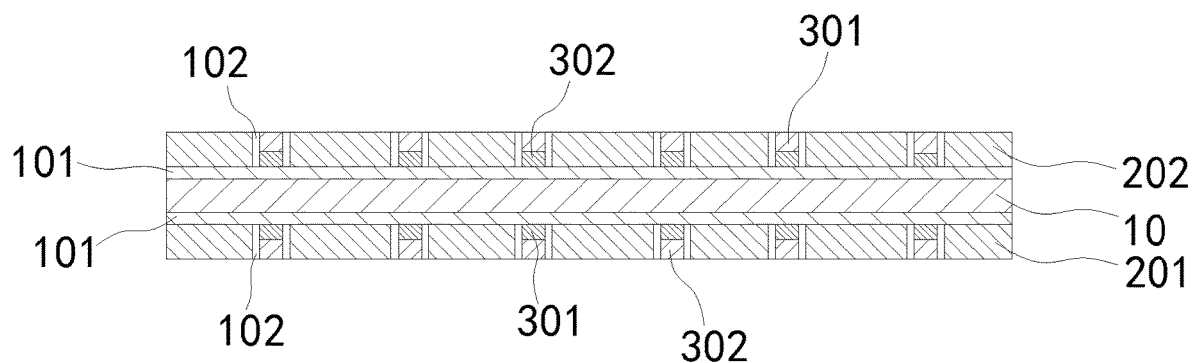
FIG. 6 is a diagram of a first embodiment in S50 of the fabrication method of a conductive film according to the present disclosure.

In this example, as shown in FIG. 6, a flame retardant 301 is filled in the blind holes, and a layer of modified paraffin 302 is filled on the flame retardant 301 for sealing; the flame retardant 301 is TMP; and the modified paraffin 302 includes the following components: 6 parts of paraffin, 0.5 part of lithium chloride, 0.5 part of conductive graphite, and 1 part of dodecanoic acid. Generally, the paraffin begins to soften at 50° C. to 60° C., and in this example, the modified paraffin 302 can increase a softening point of the paraffin to 65° C. to 80° C., thereby improving its temperature resistance.

S60: A third metal layer 103 is plated on upper and lower surfaces of the composite film by a vacuum coating technology, and a resulting product is rolled to obtain the conductive film, a structure of which is shown in FIG. 7, where the third metal layer 103 is a copper layer with a thickness of 200 nm.

Figure 7:
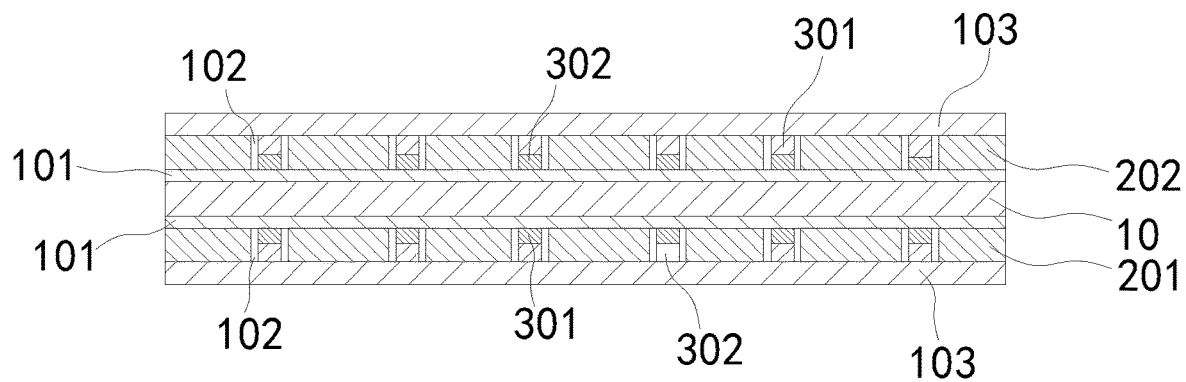
FIG. 7 is a diagram of a first embodiment in S60 of the fabrication method of a conductive film according to the present disclosure.

As shown in FIG. 7, the present disclosure also provides a conductive film, including a support layer 10, a first metal layer 101, a first film 201, a second film 202, and a third metal layer 103, where the support layer 10 is a PET film; both an upper surface and a lower surface of the support layer 10 are plated with the first metal layer 101, and the first metal layer 101 is a copper layer with a thickness of 200 nm; the first film 201 and the second film 202 are respectively compounded on surfaces of the two first metal layers 101; a plurality of circular holes 204 are formed to penetrate through the first film 201 and the second film 202, and an inner wall of the circular hole 204 is plated with a second metal layer 102 having an annular cross-section; a hole in a center of the second metal layer 102 is filled with a flame-retardant layer; and an outer surface of the first film 201 and an outer surface of the second film 202 are both plated with the third metal layer 103. In this example, the first film 201 and the second film 202 are both polypropylene (PP). It should be noted that the first film and the second film can be any one selected from the group consisting of PP, polyimide (PI), PET, and polyethylene (PE).

In this example, as shown in FIG. 7, the flame-retardant layer includes a flame retardant 301 located at a bottom layer and a modified paraffin 302 located above the flame retardant 301; and the flame retardant 301 is TMP. In addition, the third metal layer 103 is a copper layer with a thickness of 200 nm, and the second metal layer 102 is a lithium layer with a thickness of 100 nm.

In addition, the present disclosure also provides an LIB, including a conductive film fabricated by the fabrication method of a conductive film described above.

In the above example, the flame retardant 301 sealed by the modified paraffin 302 is arranged in the circular hole 204 of the second film 202, such that, when a temperature reaches a softening point of the modified paraffin 302, the paraffin melts in the hole, and the flame retardant 301 is released from the hole to prevent a battery from overheating and burning. The second metal layer 102 is a lithium layer, which can also increase an energy density of a battery after the flame retardant 301 is released. Moreover, the addition of the first metal layer 101 between the first film 201 and the second film 202 increases the electrical conductivity and tensile strength of the conductive film.

Example 2

As shown in FIG. 1, the present disclosure discloses a fabrication method of a conductive film. In this example, the fabrication method includes the following steps:

S10: A support layer 10 is selected, and a first metal layer 101 is plated on upper and lower surfaces of the support layer 10, respectively, where the support layer 10 is a PET film, and a formed structure is shown in FIG. 2.

In this example, the first metal layer 101 may be plated on the surfaces of the first support layer 10 using a vacuum coating device; the vacuum coating device may include a magnetron sputtering device or a vacuum evaporation device, and a vacuum coater can also be used; and the first metal layer 101 may be an aluminum layer with a thickness of 300 nm.

The main function of the first metal layer 101 is to increase the electrical conductivity and increase the elongation at break of the entire conductive film. In this example, the vacuum coating device is a magnetron sputtering device; and magnetron sputtering is conducted under the following conditions: vacuum degree: $0.1 \times 10^{-3}$ Pa to $1.0 \times 10^{-3}$ Pa, and sputtering gas: argon at a flow rate of 50 ml/min to 60 ml/min, and the pressure and flow rate can speed up the process and improve the production efficiency.

S20: A first film 201 is compounded on a surface of one of the first metal layers 101, and a second film 202 is compounded on a surface of the other one of the first metal layers 101. In this example, as shown in FIG. 3, the second film 202 is compounded on a surface of the first metal layer 101 located above, and the first film 201 is compounded on a surface of the first metal layer 101 located below; and a coating compounding device is used to realize the compounding of the first film 201 and the second film 202.

S30: A third film 203 is compounded on surfaces of the first film 201 and the second film 202 using a film compounding technology, and a plurality of circular holes 204 are etched to penetrate through the third film 203 and the second film 202, where a depth of each of the plurality of circular holes 204 is equal to a sum of a thicknesses of the second film 202 and a thicknesses of the third film 203. FIG. 4 is a schematic structural diagram of the plurality of circular holes 204 etched on the third film 203, and the hole has a diameter of 600 nm.

S40: A second metal layer 102 is plated on an outer surface of the third film 203 and an inner wall of the circular hole 204 using a vacuum coating technology. As shown in FIG. 5, the inner wall of the circular hole 204 is plated with the second metal layer 102, but the second metal layer 102 does not completely seal the circular hole 204, and thus a plurality of blind holes are formed on the second metal layer 102.

S50: The third film 203 is peeled off from the second film 202, while the second metal layer 102 plated on the inner wall of the circular hole 204 of the second film 202 is retained, where the second metal layer 102 is a lithium layer with a thickness of 100 nm.

Figure 8:
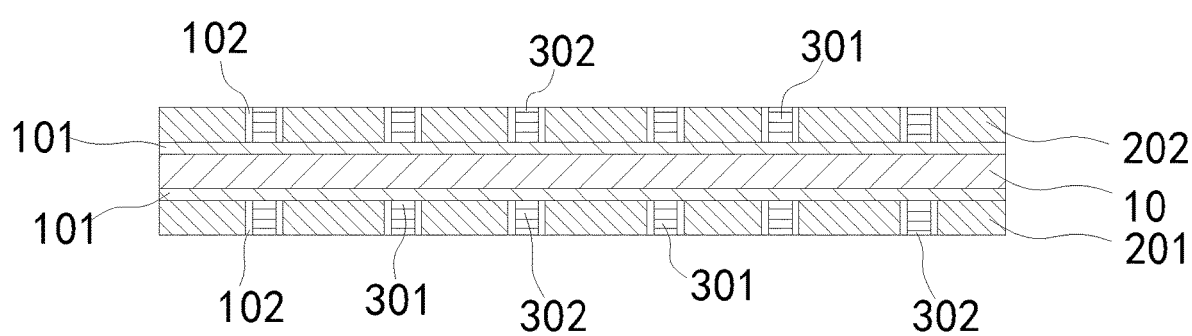
FIG. 8 is a diagram of a second embodiment in S50 of the fabrication method of a conductive film according to the present disclosure.

In this example, as shown in FIG. 8, a flame retardant 301 is filled in the blind hole, then a layer of modified paraffin 302 is filled on the flame retardant 301, then a flame retardant 301 is refilled based on the modified paraffin 302, and the modified paraffin 302 is refilled for sealing to obtain a composite film; the flame retardant 301 is TMP; and the modified paraffin 302 includes the following components: 7 parts of paraffin, 1 part of lithium chloride, 3 parts of conductive graphite, and 3 parts of dodecanoic acid. Generally, the paraffin begins to soften at 50° C. to 60° C., and in this example, the modified paraffin 302 can increase a softening point of the paraffin to 65° C. to 80° C., thereby improving its temperature resistance.

S60: A third metal layer 103 is plated on upper and lower surfaces of the composite film by a vacuum coating technology, and a resulting product is rolled to obtain the conductive film, a structure of which is shown in FIG. 9, where the third metal layer 103 is a copper layer with a thickness of 200 nm.

Figure 9:
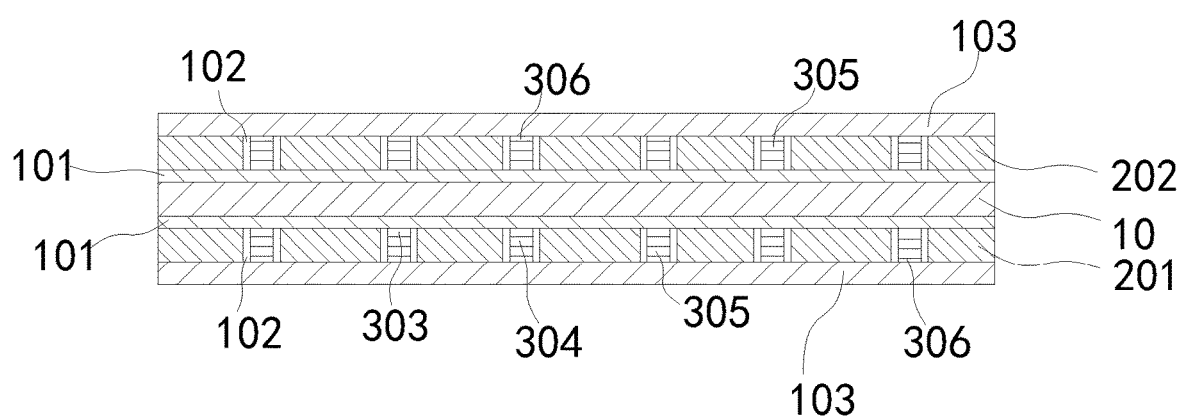
FIG. 9 is a diagram of a second embodiment in S60 of the fabrication method of a conductive film according to the present disclosure.

As shown in FIG. 9, the present disclosure also provides a conductive film, including a support layer 10, a first metal layer 101, a first film 201, a second film 202, and a third metal layer 103, where the support layer 10 is a PET film; both an upper surface and a lower surface of the support layer 10 are plated with the first metal layer 101, and the first metal layer 101 is a copper layer with a thickness of 300 nm; the first film 201 and the second film 202 are respectively compounded on surfaces of the two first metal layers 101; a plurality of circular holes 204 are formed to penetrate through the first film 201 and the second film 202, and an inner wall of the circular hole 204 is plated with a second metal layer 102 having an annular cross-section; a hole in a center of the second metal layer 102 is filled with a flame-retardant layer; and an outer surface of the first film 201 and an outer surface of the second film 202 are both plated with the third metal layer 103. In this example, the first film 201 and the second film 202 are both PI. It should be noted that the first film 201 and the second film 202 can be any one selected from the group consisting of PP, PI, PET, and PE.

In this example, as shown in FIG. 9, the flame-retardant layer includes a first flame retardant 303 at a bottom layer, a first modified paraffin 304 above the first flame retardant 303, a second flame retardant 305 above the first modified paraffin 304, and a second modified paraffin 306 above the second flame retardant 305, which can repeatedly prevent an LIB from burning to further improve the safety performance of the battery; and the flame retardant 301 is TMP. In addition, the third metal layer 103 is a copper layer with a thickness of 300 nm, and the second metal layer 102 is a lithium layer with a thickness of 100 nm.

In addition, the present disclosure also provides an LIB, including a conductive film fabricated by the fabrication method of a conductive film described above.

In the above example, the flame retardant sealed by the modified paraffin is arranged in the circular hole 204 of the second film 202, such that, when a temperature reaches a softening point of the modified paraffin, the paraffin melts in the hole, and the flame retardant is released from the hole to prevent a battery from overheating and burning. The second metal layer 102 is a lithium layer, which can also increase an energy density of a battery after the flame retardant is released. Moreover, the addition of the first metal layer 101 between the first film 201 and the second film 202 increases the electrical conductivity and tensile strength of the conductive film.

Example 3

As shown in FIG. 1, the present disclosure discloses a fabrication method of a conductive film. In this example, the fabrication method includes the following steps:

S10: A support layer 10 is selected, and a first metal layer 101 is plated on upper and lower surfaces of the support layer 10, respectively, where the support layer 10 is a PET film, and a formed structure is shown in FIG. 2.

In this example, the first metal layer 101 may be plated on the surfaces of the first support layer 10 using a vacuum coating device; the vacuum coating device may include a magnetron sputtering device or a vacuum evaporation device, and a vacuum coater can also be used; and the first metal layer 101 may be a copper layer with a thickness of 250 nm.

The main function of the first metal layer 101 is to increase the electrical conductivity and increase the elongation at break of the entire conductive film. In this example, the vacuum coating device is a magnetron sputtering device; and magnetron sputtering is conducted under the following conditions: vacuum degree: $0.1 \times 10^{-3}$ Pa to $1.0 \times 10^{-3}$ Pa, and sputtering gas: argon at a flow rate of 50 ml/min to 60 ml/min, and the pressure and flow rate can speed up the process and improve the production efficiency.

S20: A first film 201 is compounded on a surface of one of the first metal layers 101, and a second film 202 is compounded on a surface of the other one of the first metal layers 101. In this example, as shown in FIG. 3, the second film 202 is compounded on a surface of the first metal layer 101 located above, and the first film 201 is compounded on a surface of the first metal layer 101 located below; and a coating compounding device is used to realize the compounding of the first film 201 and the second film 202.

S30: A third film 203 is compounded on surfaces of the first film 201 and the second film 202 using a film compounding technology, and a plurality of circular holes 204 are etched to penetrate through the third film 203 and the second film 202, where a depth of each of the plurality of circular holes 204 is equal to a sum of a thicknesses of the second film 202 and a thicknesses of the third film 203. FIG. 4 is a schematic structural diagram of the plurality of circular holes 204 etched on the third film 203, and the holes have a diameter of 600 nm.

S40: A second metal layer 102 is plated on an outer surface of the third film 203 and an inner wall of the circular hole 204 using a vacuum coating technology. As shown in FIG. 5, the inner wall of the circular hole 204 is plated with the second metal layer 102, but the second metal layer 102 does not completely seal the circular hole 204, and thus a plurality of blind holes are formed on the second metal layer 102.

S50: The third film 203 is peeled off from the second film 202, while the second metal layer 102 plated on the inner wall of the circular hole 204 of the second film 202 is retained, where the second metal layer 102 is a lithium layer with a thickness of 20 nm.

In this example, as shown in FIG. 6, a flame retardant 301 is filled in the blind holes, and a layer of modified paraffin 302 is filled on the flame retardant 301 for sealing; the flame retardant 301 is TMP; and the modified paraffin 302 includes the following components: 6 parts of paraffin, 0.5 part of lithium chloride, 0.5 part of conductive graphite, and 1 part of dodecanoic acid. Generally, the paraffin begins to soften at 50° C. to 60° C., and in this example, the modified paraffin 302 can increase a softening point of the paraffin to 65° C. to 80° C., thereby improving its temperature resistance.

S60: A third metal layer 103 is plated on upper and lower surfaces of the composite film by a vacuum coating technology, and a resulting product is rolled to obtain the conductive film, a structure of which is shown in FIG. 7, where the third metal layer 103 is a copper layer with a thickness of 200 nm.

As shown in FIG. 7, the present disclosure also provides a conductive film, including a support layer 10, a first metal layer 101, a first film 201, a second film 202, and a third metal layer 103, where the support layer 10 is a PET film; both an upper surface and a lower surface of the support layer 10 are plated with the first metal layer 101, and the first metal layer 101 is a copper layer with a thickness of 250 nm; the first film 201 and the second film 202 are respectively compounded on surfaces of the two first metal layers 101; a plurality of circular holes 204 are formed to penetrate through the first film 201 and the second film 202, and an inner wall of the circular hole 204 is plated with a second metal layer 102 having an annular cross-section; a hole in a center of the second metal layer 102 is filled with a flame-retardant layer; and an outer surface of the first film 201 and an outer surface of the second film 202 are both plated with the third metal layer 103. In this example, the first film 201 and the second film 202 are both PET. It should be noted that the first film 201 and the second film 202 can be any one selected from the group consisting of PP, PI, PET, and PE.

In this example, as shown in FIG. 7, the flame-retardant layer includes a flame retardant 301 located at a bottom layer and a modified paraffin 302 located above the flame retardant 301; and the flame retardant 301 is TMP. In addition, the third metal layer 103 is a copper layer with a thickness of 250 nm, and the second metal layer 102 is a lithium layer with a thickness of 20 nm.

In addition, the present disclosure also provides an LIB, including a conductive film fabricated by the fabrication method of a conductive film described above.

In the above example, the flame retardant 301 sealed by the modified paraffin 302 is arranged in the circular hole 204 of the second film 202, such that, when a temperature reaches a softening point of the modified paraffin 302, the paraffin melts in the hole, and the flame retardant 301 is released from the hole to prevent a battery from overheating and burning. The second metal layer 102 is a lithium layer, which can also increase an energy density of a battery after the flame retardant 301 is released. Moreover, the addition of the first metal layer 101 between the first film 201 and the second film 202 increases the electrical conductivity and tensile strength of the conductive film.

In addition, the present disclosure also provides the following two comparative examples:

I. Fabrication of Comparative Examples:
1. A fabrication method of Comparative Example 1 is the practice in the prior art, where both upper and lower surfaces of the film are plated with a metal layer, and in this comparative example, both of the surfaces are plated with copper.
2. A fabrication method of Comparative Example 2 is the same as the method provided by the present disclosure, except that the middle support layer 10 is not plated with a metal.
3. The example refers to a sample obtained by the method provided by the present disclosure.

The above samples were cut into test specimens with a length of 20 CM and a width of 2 CM, and then tested by an intelligent electronic tensile testing machine of Zhongnuo Instruments; and a softening point test was conducted using an asphalt softening point tester.

A. Tensile Strength Test

| Tensile strength | Comparative Example 1 | Comparative Example 2 | Example |
|---|---|---|---|
| 1 | 40 MP | 45 MP | 52 MP |
| 2 | 39.5 MP | 43 MP | 55 MP |

Through comparison, it is found that the conductive film fabricated by the method provided by the present disclosure shows a significantly-improved tensile strength.

B. Electrical Conductivity Test

Method: Positive and negative electrodes of a universal meter were directly connected to two ends of the non-metallic material, and then the universal meter was switched to the ohm gear to acquire resistance data. The higher the resistance, the worse the electrical conductivity.

| Electrical conductivity | Comparative Example 1 | Comparative Example 2 | Example |
|---|---|---|---|
| 1 | 7 mΩ | 8.5 mΩ | 6.5 mΩ |
| 2 | 7.3 mΩ | 8.6 mΩ | 6.3 mΩ |

According to comparison, the conductive film fabricated by the method provided by the present disclosure has a relatively-small resistance value, indicating that the electrical conductivity is obviously improved.

C. Softening Point Test Data of Modified Paraffin 302

| Sample | Paraffin | Lithium chloride | Conductive graphite | Dodecanoic acid | Melting point |
|---|---|---|---|---|---|
| Softening point of modified paraffin 302 | 6 parts | 0.5 part | 0.5 part | 3 parts | 80° C. |
| Softening point of modified paraffin 302 | 6.5 parts | 0.75 part | 2.75 parts | 2 parts | 72.5° C. |
| Softening point of modified paraffin 302 | 7 parts | 1 part | 1 part | 1 part | 65° C. |

II. Fabrication of Comparative LIBs:

Two comparative examples were adopted for comparison. Assembly of LIB of Comparative Example 1: Fabrication of a positive electrode sheet: a metal aluminum layer with a thickness of 1 μm was plated on two sides of PET with a thickness of 2 μm, and then an active material layer is coated on the metal aluminum layer, where the active material included lithium iron phosphate (LFP); acetylene black (AB) was adopted as a conductive agent, and polyvinylidene fluoride (PVDF) was adopted as a binder; and the active material, the conductive agent, and the binder had a ratio of 7:1:2. Fabrication of a negative electrode sheet: PET with a thickness of 2 μm was used as a substrate, and then a metal copper layer with a thickness of 1 μm was plated on the PET; lithium titanate was adopted as a negative electrode active material, PVDF was adopted as a binder, and graphite was adopted as a conductive agent; and the negative electrode active material, the binder, and the conductive agent had a ratio of 8:1:1. A 1 M LiPF6 solution was adopted as an electrolyte. The above components were then assembled into a button battery.

Fabrication of LIB of Example 1: The LIB of this example was different from the LIB obtained in Comparative Example 1 in that the conductive film provided by the present disclosure was used as a substrate of a negative electrode sheet.

The fabrication in Comparative Example 2 was different from the example in that there were no holes as in the example and there was also no flame-retardant layer in the hole.

Fabrication of Example 2: The LIB of Example 2 was the same as the battery of Example 1, except that there were the second flame retardant and the second modified paraffin inside the conductive film used in the substrate of the negative electrode sheet.

The batteries obtained above were placed in an oven, heated to 100° C. at a rate of 5° C./min, and then kept at the temperature for 30 min. If there is no fire and no smoke, it is determined as excellent. Results were shown as follows:

| Sample | Implementation effect |
|---|---|
| Comparative Example 1-1 | Fire |
| Comparative Example 1-2 | Fire |
| Comparative Example 2-1 | Fire |
| Comparative Example 2-2 | Fire |

-continued

| Sample | Implementation effect |
|---|---|
| Example 1-1 | There are no adverse phenomena such as fire and smoke |
| Example 1-2 | There are no adverse phenomena such as fire and smoke |
| Example 2-1 | There are no adverse phenomena such as fire and smoke |
| Example 2-2 | There are no adverse phenomena such as fire and smoke |

Examples 1-1 and 1-2 after undergoing the above experiment were taken out, cooled, and then compared with Example 2. Similarly, Examples 1 and 2 were heated to 110° C. at a rate of 5° C./min, and then kept at the temperature for 30 min.

The obtained data were shown as follows:

| Sample | Effect |
|---|---|
| Example 1-1 | Smoke |
| Example 1-2 | Fire |
| Example 2-1 | There are no adverse phenomena such as fire and smoke |
| Example 2-2 | There are no adverse phenomena such as fire and smoke |

The preferred examples of the present application have been described in detail above, but the present application is not limited to the examples. Those skilled in the art may make various equivalent modifications or substitutions without departing from the spirit of the present application, and these equivalent modifications or substitutions are all included in the scope defined by the claims of the present application.

The present disclosure provides a conductive film, a fabrication method of the conductive film, and an LIB. A flame retardant sealed by a modified paraffin is arranged in a circular hole of a second film, such that, when a temperature reaches a softening point of the modified paraffin, the paraffin melts in the hole, and the flame retardant is released from the hole to prevent a battery from overheating and burning, thereby improving the safety of the LIB. A second metal layer is a lithium layer, and after the flame retardant is released, an energy density of an LIB can also be increased, making the LIB have promising popularization and application prospects. Therefore, the conductive film, the fabrication method of the conductive film, and the LIB of the present disclosure have practicability.

What is claimed is:

1. A fabrication method of a conductive film, comprising the following steps:
   S10: selecting a support layer, and plating a first metal layer on an upper surface and a lower surface of the support layer, respectively;
   S20: compounding a first film on a surface of the first metal layer on the upper surface of the support layer, and compounding a second film on a surface of the first metal layer on the lower surface of the support layer;
   S30: compounding a third film on a surface of the first film and a surface of the second film by a film compounding technology, respectively, and etching a plurality of circular holes penetrating through the third film and the second film, wherein a depth of each of the plurality of circular holes is equal to a sum of a thickness of the third film and a thickness of the second film;
   S40: plating a second metal layer on an outer surface of the third film and an inner wall of each of the plurality of circular holes, respectively, by a vacuum coating technology;
   S50: peeling off the third film from the second film while retaining the second metal layer plated on the inner wall of each of the plurality of circular holes of the second film;
   filling a first flame retardant in each of the plurality of circular holes, and filling a layer of a first modified paraffin on the first flame retardant for sealing to obtain a first composite film;
   or, filling the first flame retardant in each of the plurality of circular holes, filling a layer of the first modified paraffin on the first flame retardant, refilling a second flame retardant based on the first modified paraffin, and refilling a second modified paraffin for sealing to obtain a second composite film; and
   S60: plating a third metal layer on an upper surface and a lower surface of the first composite film or the second composite film, respectively, by the vacuum coating technology, and rolling to obtain the conductive film.

2. The fabrication method of the conductive film according to claim 1, wherein in S10, the first metal layer is respectively plated on the upper surface and the lower surface of the support layer using a vacuum coating device, and the vacuum coating device comprises a magnetron sputtering device or a vacuum evaporation device.

3. The fabrication method of the conductive film according to claim 1, wherein the first metal layer and the third metal layer each are a copper or aluminum layer with a thickness of 200 nm to 300 nm, and the second metal layer is a lithium layer with a thickness of 20 nm to 100 nm.

4. The fabrication method of the conductive film according to claim 1, wherein in S20, a coating compounding device is configured to realize the step of compounding the first film and the step of compounding the second film.

5. The fabrication method of the conductive film according to claim 1, wherein in S30, each of plurality of the circular holes has a diameter of 500 nm to 600 nm.

6. The fabrication method of the conductive film according to claim 1, wherein in S40, after the second metal layer is plated on the outer surface of the third film and in each of the plurality of circular holes, respectively, an etching technique is configured to remove a metal layer at a center of each of the plurality of circular holes, and a metal layer on the inner wall of each of the plurality of circular holes is reserved.

7. The fabrication method of the conductive film according to claim 1, wherein in S50, the first flame retardant and the second flame retardant are trimethyl phosphate.

8. The fabrication method of the conductive film according to claim 1, wherein in S50, each of the first modified paraffin and the second modified paraffin comprises the following components: 6 to 7 parts of paraffin, 0.5 to 1 part of lithium chloride, 0.5 to 3 parts of conductive graphite, and 1 to 3 parts of dodecanoic acid; and the first modified paraffin and the second modified paraffin have a softening point of 65° C. to 80° C.

9. A conductive film, comprising a support layer, a first metal layer, a first film, a second film, and a third metal layer;
   wherein an upper surface and a lower surface of the support layer are plated with the first metal layer, respectively, and the first film and the second film are compounded on surfaces of the two first metal layers, respectively;

a plurality of circular holes penetrate through the first film and the second film, an inner wall of each of the plurality of circular holes is plated with a second metal layer having an annular cross-section, and a flame-retardant layer is filled in each of the plurality of circular holes plated with the second metal layer; and an outer surface of the first film and an outer surface of the second film are plated with the third metal layer, respectively.

10. The conductive film according to claim 9, wherein the flame-retardant layer comprises a flame retardant at a bottom layer and a modified paraffin above the flame retardant; and the flame retardant is trimethyl phosphate.

11. The conductive film according to claim 9, wherein the flame-retardant layer comprises a first flame retardant at a bottom layer, a first modified paraffin above the first flame retardant, a second flame retardant above the first modified paraffin, and a second modified paraffin above the second flame retardant; and the first flame retardant and the second flame retardant are trimethyl phosphate.

12. The conductive film according to claim 9, wherein the first metal layer and the third metal layer each are a copper or aluminum layer with a thickness of 200 nm to 300 nm, and the second metal layer is a lithium layer with a thickness of 20 nm to 100 nm.

13. A lithium-ion battery (LIB), comprising a conductive film, wherein the conductive film is fabricated by the fabrication method according to claim 1.

14. The LIB according to claim 13, wherein the fabrication method of the conductive film, wherein in S10, the first metal layer is respectively plated on the upper surface and the lower surface of the support layer using a vacuum coating device, and the vacuum coating device comprises a magnetron sputtering device or a vacuum evaporation device.

15. The LIB according to claim 13, wherein the fabrication method of the conductive film, wherein the first metal layer and the third metal layer each are a copper or aluminum layer with a thickness of 200 nm to 300 nm, and the second metal layer is a lithium layer with a thickness of 20 nm to 100 nm.

16. The LIB according to claim 13, wherein the fabrication method of the conductive film, wherein in S20, a coating compounding device is configured to realize the step of compounding the first film and the step of compounding the second film.

17. The LIB according to claim 13, wherein the fabrication method of the conductive film, wherein in S30, each of the plurality of circular holes has a diameter of 500 nm to 600 nm.

18. The LIB according to claim 13, wherein the fabrication method of the conductive film, wherein in S40, after the second metal layer is plated on the outer surface of the third film and in each of the plurality of circular holes, respectively, an etching technique is configured to remove a metal layer at a center of each of the plurality of circular holes, and a metal layer on the inner wall of each of the plurality of circular holes is reserved.

19. The LIB according to claim 13, wherein the fabrication method of the conductive film, wherein in S50, the first flame retardant and the second flame retardant are trimethyl phosphate.

20. The LIB according to claim 13, wherein the fabrication method of the conductive film, wherein in S50, each of the first modified paraffin and the second modified paraffin comprises the following components: 6 to 7 parts of paraffin, 0.5 to 1 part of lithium chloride, 0.5 to 3 parts of conductive graphite, and 1 to 3 parts of dodecanoic acid; and the first modified paraffin and second modified paraffin have a softening point of 65° C. to 80° C.

* * * * *